US007986796B2

(12) United States Patent
Kim et al.

(10) Patent No.: US 7,986,796 B2

(45) Date of Patent: Jul. 26, 2011

(54) APPARATUS TO GENERATE MULTI-CHANNEL AUDIO SIGNALS AND METHOD THEREOF

(75) Inventors: Seoung-hun Kim, Suwon-si (KR); Han-gil Moon, Seoul (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 1343 days.

(21) Appl. No.: 11/522,945

(22) Filed: Sep. 19, 2006

(65) Prior Publication Data

US 2007/0147623 A1 Jun. 28, 2007

(30) Foreign Application Priority Data

Dec. 22, 2005 (KR) ........................ 10-2005-0127781

(51) Int. Cl.
*H03G 5/00* (2006.01)

(52) U.S. Cl. ........................................ 381/98; 704/205

(58) Field of Classification Search .............. 381/17–22, 381/56–58, 110, 27, 98, 94.1, 94.2, 198; 700/94; 704/205, 206

See application file for complete search history.

(56) References Cited

U.S. PATENT DOCUMENTS 4,433,435 A * 2/1984 David .......................... 381/94.2
5,701,598 A * 12/1997 Atkinson .................. 455/161.2
7,035,413 B1 * 4/2006 Waller et al. .................. 381/17

* cited by examiner

*Primary Examiner* — Xu Mei
*Assistant Examiner* — Lun-See Lao
(74) *Attorney, Agent, or Firm* — Stanzione & Kim, LLP

(57) ABSTRACT

An apparatus and method of generating multi-channel audio signals includes a voice signal removal unit to generate a first signal by removing one or more components of a plurality of frequency bands corresponding to a voice frequency range from an input signal, a voice signal amplification unit to generate a second signal by calculating a sum of channel signals of the input signal and amplifying one or more components of the plurality of the frequency bands corresponding to the voice frequency range of the sum signal, a control filter to generate a third signal by compensating for a level of the first signal, and a multi-channel audio generation unit to generate a center-channel audio signal and a front-channel audio signal using the second, third, and fourth signals.

25 Claims, 5 Drawing Sheets

APPARATUS TO GENERATE MULTI-CHANNEL AUDIO SIGNALS AND METHOD THEREOF

CROSS-REFERENCE TO RELATED APPLICATIONS

This application claims priority under 35 U.S.C. §119(a) from Korean Patent Application No. 10-2005-0127781, filed on Dec. 22, 2005, in the Korean Intellectual Property Office, the disclosure of which is incorporated herein in its entirety by reference.

BACKGROUND OF THE INVENTION

1. Field of the Invention

The present general inventive concept relates to an audio apparatus, and more particularly, to an apparatus and method of generating multi-channel audio signals.

2. Description of the Related Art

Multi-channel audio systems have become a standard for movies and home theaters and have been used in audio applications such as music, cars, and computers. In addition, the multi-channel audio systems are also considered to be used in television broadcasting. The multi-channel audio systems provide a surround sound environment to enhance a listening quality and overall presentation of an audio-visual system. Conventional stereo systems have been replaced with the multi-channel audio system due to various factors. One of the most important factors is consumer's demand for high quality audio. For the high quality audio, audio systems having more channels, hi-fi channels, and enhanced channel separation are needed. To meet the demand, 2-channel audio signals need to be converted into signals which are optimized for the multi-channel audio system such as 4-channel, 4.1-channel, and 5.1-channel audio systems.

FIG. 1 is a block diagram illustrating a conventional multi-channel audio signal generation apparatus for converting 2-channel audio signals into 4-channel audio signals.

A correlation measurement unit 100 calculates signals L−R and L+R based on input sources L and R and generates a surround-channel signal S and a center-channel signal C using the signals L−R and L+R. In addition, the correlation measurement unit 100 measures a correlation between the surround-channel signal S and the center-channel signal C. Then, the correlation measurement unit 100 generates control voltages according to the measured correlation and applies the control voltages to a matrix generation unit 110.

The matrix generation unit 110 generates a matrix which minimizes interferences of the signals using the input sources L and R and the control voltages generated by the correlation measurement unit 100.

A channel generation unit 120 generates a left-channel signal LEFT, a right-channel signal RIGHT, a center-channel signal CENTER, and a surround-channel signal SURROUND using the matrix generated by the matrix generation unit 110.

However, conventional multi-channel audio signal generation apparatuses require complex calculations such as correlation measurement and matrix generation and have problems of unreliable channel separation for signals which are not optimally encoded for the conventional multi-channel audio signal generation apparatuses, and generation of an signal excessively concentrated to a center-channel for a signal which is close to a mono-type signal.

SUMMARY OF THE INVENTION

The present general inventive concept provides a method of generating multi-channel audio signals having a high listening quality and a high channel separation using a signal to remove components corresponding to a formant frequency range from an input signal and a signal to amplify the components corresponding to the formant frequency range of the input signal.

The present general inventive concept also provides an apparatus to generate multi-channel audio signals.

Additional aspects and advantages of the present general inventive concept will be set forth in part in the description which follows and, in part, will be obvious from the description, or may be learned by practice of the general inventive concept.

The foregoing and other aspects of the present inventive concept may be achieved by providing an apparatus to generate multi-channel audio signals, the apparatus including a voice signal removal unit to generate a first signal by removing at least a portion of components of a plurality of frequency bands corresponding to a voice frequency range from an input signal, a voice signal amplification unit to generate a second signal by calculating a sum signal of channel signals of the input signal and amplifying at least a portion of the components of the plurality of the frequency bands of the sum signal corresponding to the voice frequency range, a control filter to generate a third signal by compensating for a level of the first signal, and a multi-channel audio signal generation unit to generate a center-channel audio signal and a front-channel audio signal using the second and third signals.

The foregoing and other aspects of the present inventive concept may also be achieved by providing a method of generating multi-channel audio signals, the method including generating a first signal by removing at least a portion of components of a plurality of frequency bands corresponding to a voice frequency range from an input signal, generating a second signal by calculating a sum of channel signals of the input signal and amplifying at least a portion of the component of at least one of the frequency bands corresponding to the voice frequency range; and generating a center-channel audio signal and a front-channel audio signal using the first signal and the second signal.

The voice signal removal unit may be configured to remove components corresponding to a formant frequency range of the input signal.

The voice signal amplification unit may be configured to amplify components of the sum signal corresponding to a formant frequency range.

A level of the first signal may be compensated by amplifying a predetermined intermediate frequency band of the first signal.

The predetermined intermediate frequency band may be a band of 1 kHz to 4 kHz.

The foregoing and other aspects of the present inventive concept may also be achieved by providing a computer-readable medium having embodied thereon a computer program to perform a method of generating multi-channel audio signals, the method including generating a first signal by removing one or more components of a plurality of frequency bands corresponding to a voice frequency range from an input signal, generating a second signal by calculating a sum of channel signals of the input signal and amplifying the one or more components of at least one of the frequency bands corresponding to the voice frequency range, and generating a center-channel audio signal and a front-channel audio signal using the first signal and the second signal.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
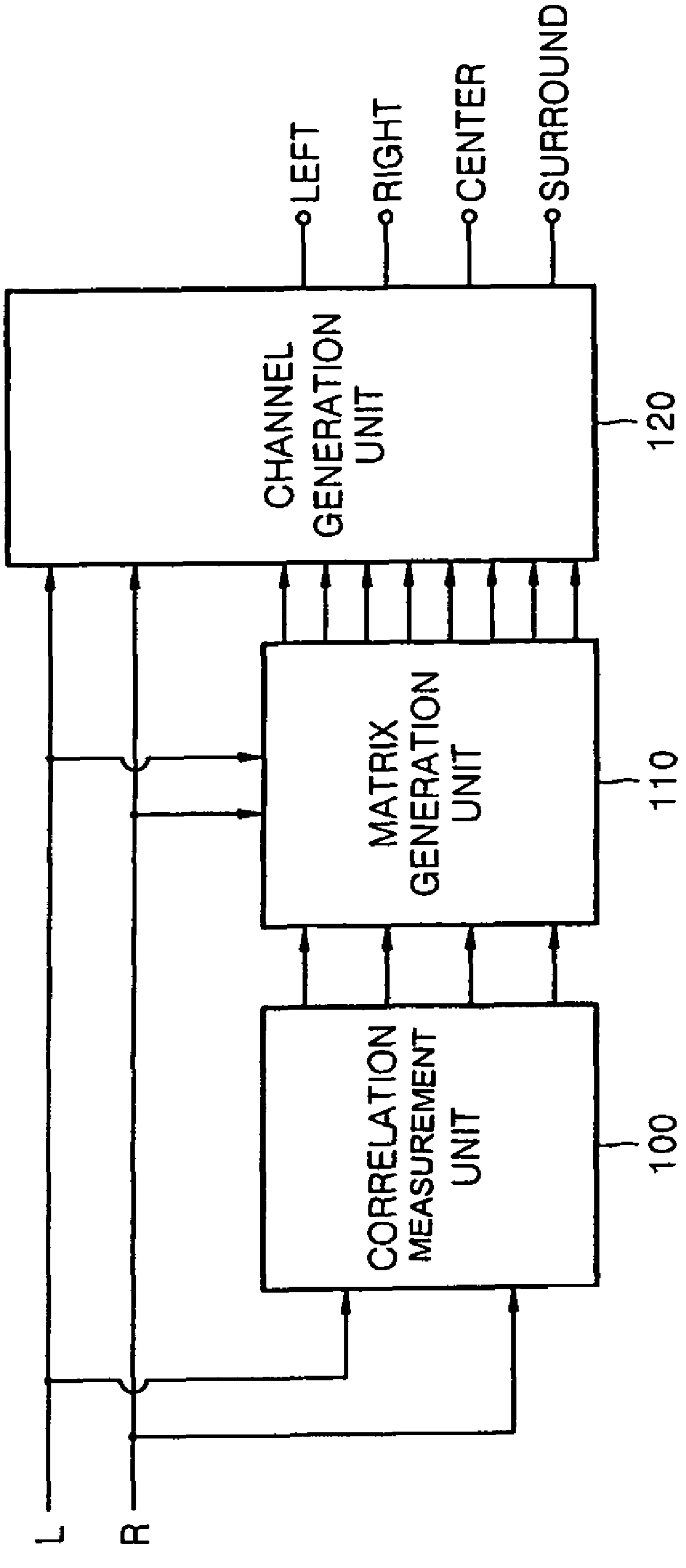
FIG. 1 is a block diagram illustrating a conventional multi-channel audio signal generation apparatus.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
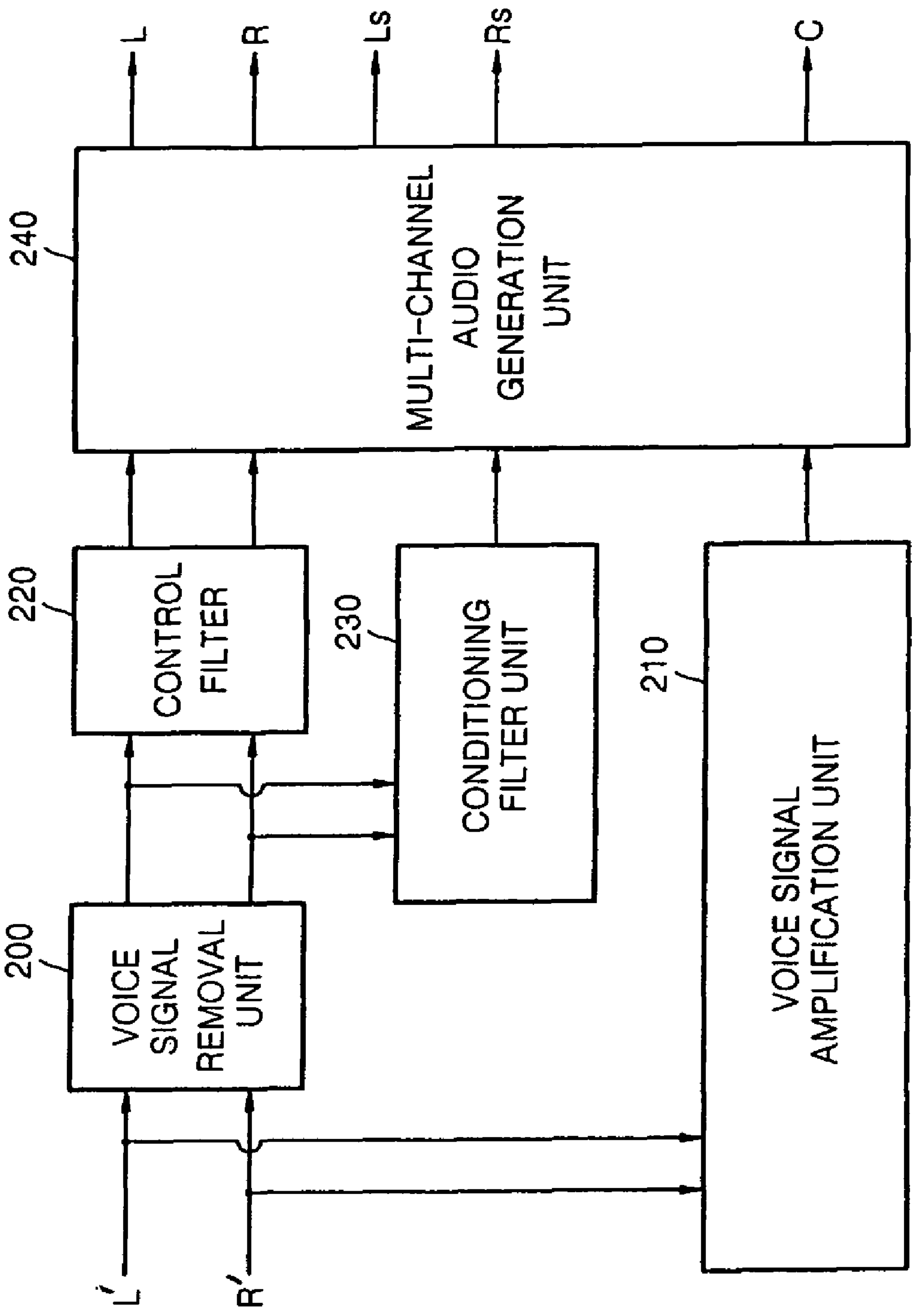
FIG. 2 is a block diagram illustrating a multi-channel audio signal generation apparatus according to an embodiment of the present general inventive concept.

FIG. 2 is a block diagram illustrating a multi-channel audio signal generation apparatus according to an embodiment of the present general inventive concept.

A voice signal removal unit 200 generates a first signal by removing components corresponding to a voice frequency range from an input signal having input channel signals, for example, left and right channel signals L' and R'. The first signal may be the voice frequency range-removed channel signals.

A voice signal is a result of stressing specific harmonic components and suppressing other harmonic components by changing a magnitude and shape of a mouth opening and moving a tongue. In a frequency spectrum of the voice signal, there are a series of peaks and troughs, although a basic frequency of the voice signal does not change. Here, the peaks distributed in the spectrum are called "formants."

The voice signal removal unit 200 may be configured to remove components of frequency bands of the input signal corresponding to a formant frequency range.

A voice signal amplification unit 210 calculates a sum signal using input channel signals L' and R' of the input signal and amplifies a voice frequency range of the sum signal to generate a second signal. The second signal may be a voice-frequency-amplified signal of the input signal. The sum signal calculated in the voice signal amplification unit 210 is obtained by synthesizing the input channel signals L' and R' of the input signal and amplifying a component which is common to the input channel signals L' and R'.

The voice signal amplification unit 210 is configured to amplify components of frequency bands of the sum signal corresponding to the formant frequency range.

A control filter 220 generates a third signal of which channel separation is enhanced by compensating for a level of the first signal. The third signal may be channel-separation-enhanced signals of the first signal. The control filter 220 may be configured to amplify components of a specific frequency band of the first signal. The control filter 220 may be a band pass filter which band-passes components of the specific frequency band of the first signal.

A conditioning filter unit 230 calculates a difference signal using channel signals of the first signal and removes components corresponding to a predetermined intermediate frequency band from the difference signal to generate a fourth signal. The difference signal calculated by the conditioning filter unit 230 may be a signal in which components common to channel signals of the first signal are removed from the first signal.

A multi-channel audio generation unit 240 generates a center-channel audio signal C, front-channel audio signals L and R, and surround-channel audio signals Ls and Rs by using the second signal, the third signal, and the fourth signal.

Figure 3:
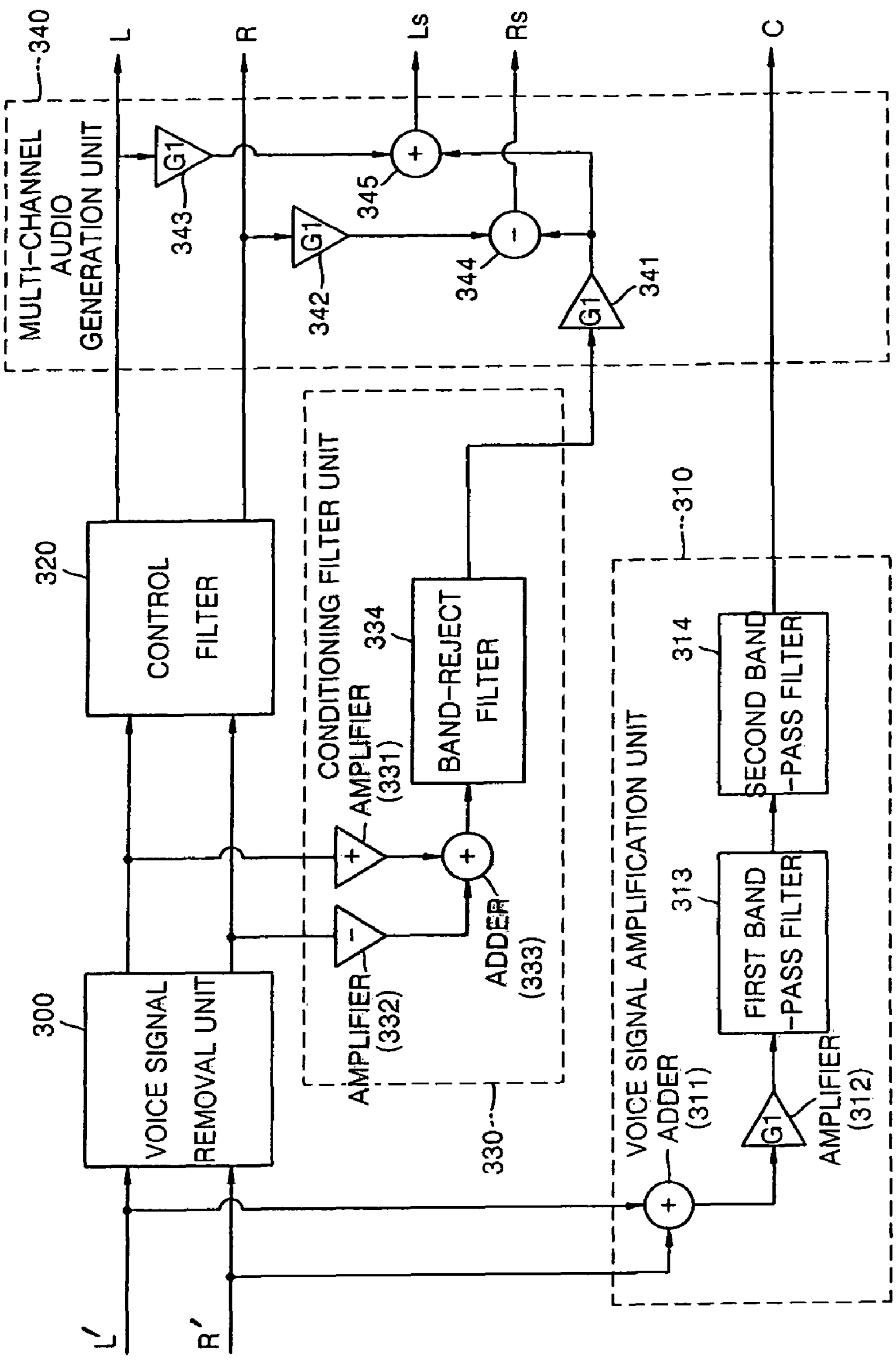
FIG. 3 is a block diagram illustrating a multi-channel audio signal generation apparatus according to an embodiment of the present general inventive concept.

FIG. 3 is a block diagram illustrating a multi-channel audio signal generation apparatus according to an embodiment of the present general inventive concept.

A voice signal removal unit 300 generates the first signal by removing components corresponding to a voice frequency range from an input signal having input channel signals, for example, left and right channel signals L' and R'.

The voice signal removal unit 300 may include a plurality of band-reject filters to remove components of frequency bands of the input signal corresponding to a formant frequency range. The band-reject filters may be a plurality of notch filters. In this case, the band-reject filters have different central frequencies. The central frequency of each band-reject filter may be one of 320 Hz, 500 Hz, 700 Hz, 1 kHz, 1.5 kHz, and 2.3 kHz. In other words, when magnitudes of frequency components in the vicinity of 320 Hz, 500 Hz, 700 Hz, 1 kHz, 1.5 kHz, or 2.3 kHz are attenuated, most components in the voice frequency range are removed.

A voice signal amplification unit 310 generates a second signal by calculating a sum signal using the input channel signals of the input signal and amplifying the voice frequency range of the sum signal. The sum signal is calculated by an adder 311 and amplified by an amplifier 312.

A first band-pass filter 313 of the voice signal amplification unit 310 passes a specific frequency band of the sum signal to increase channel separation of the calculated sum signal.

A second band-pass filter 314 of the voice signal amplification unit 310 includes a plurality of band-pass filters which pass components of the sum signal corresponding to the formant frequency range to generate the second signal. The band-pass filters have different central frequencies. The central frequency of each of the band-pass filter may be one of 320 Hz, 500 Hz, 700 Hz, 1 kHz, 1.5 kHz, and 2.3 kHz. In other words, when the magnitudes of the frequency components in the vicinity of 320 Hz, 500 Hz, 700 Hz, 1 kHz, 1.5 kHz, or 2.3 kHz are amplified comparatively, a signal of which the voice frequency range is strengthened is obtained.

The voice signal amplification unit 310 may include the first band-pass filter 313 and the second band-pass filter 314.

The first band-pass filter 313 band-passes the frequency band of the sum signal corresponding to the voice frequency range. The first band-pass filter 313 may be configured to filter a frequency band of 200 Hz to 2 kHz of the sum signal to improve a channel separation in a center channel.

The second band-pass filter 314 is one of the band-pass filters described above. In other words, the second band-pass filter 314 passes components of the sum signal in the vicinity of 320 Hz, 500 Hz, 700 Hz, 1 kHz, 1.5 kHz, or 2.3 kHz which corresponds to the voice frequency range.

A control filter 320 generates a third signal by compensating for a level of the first signal of which channel separation is enhanced. The control filter 320 may be a band-pass filter band-passing components corresponding to a predetermined intermediate frequency band. The predetermined intermediate frequency band may be a frequency band of 1 kHz to 4 kHz.

A conditioning filter 330 generates a fourth signal by calculating a difference signal using the channel signals of the first signal and removing components from the difference signal corresponding to the predetermined intermediate frequency band. At this time, the difference signal is calculated by amplifiers 331 and 332 and an adder 333.

A band-reject filter 334 of the conditioning filter unit 330 removes signals corresponding to the predetermined intermediate frequency band from the difference signal. The predetermined intermediate frequency band may be a frequency band of 1 kHz to 4 kHz. If the frequency band of 1 kHz to 4 kHz is removed from the difference signal, channel separation between a front channel and a surround channel can be improved.

A multi-channel audio generation unit 340 generates multi-channel audio signals, for example, a center-channel audio signal C, front-channel audio signals of left and right components L and R, and surround-channel audio signals of left and right components Ls and Rs by using the second signal, the third signal, and the fourth signal. The multi-channel audio generation unit 340 bypasses the second signal to generate the center-channel audio signal C. The multi-channel audio generation unit 340 bypasses the third signal to generate the front-channel audio signals L and R. The multi-channel audio generation unit 340 synthesizes the left channel component L of the third signal and fourth signal and synthesizes the right channel component R of the third signal and fourth signal to generate the surround-channel audio signal of left and right components Ls and Rs.

Figure 4:
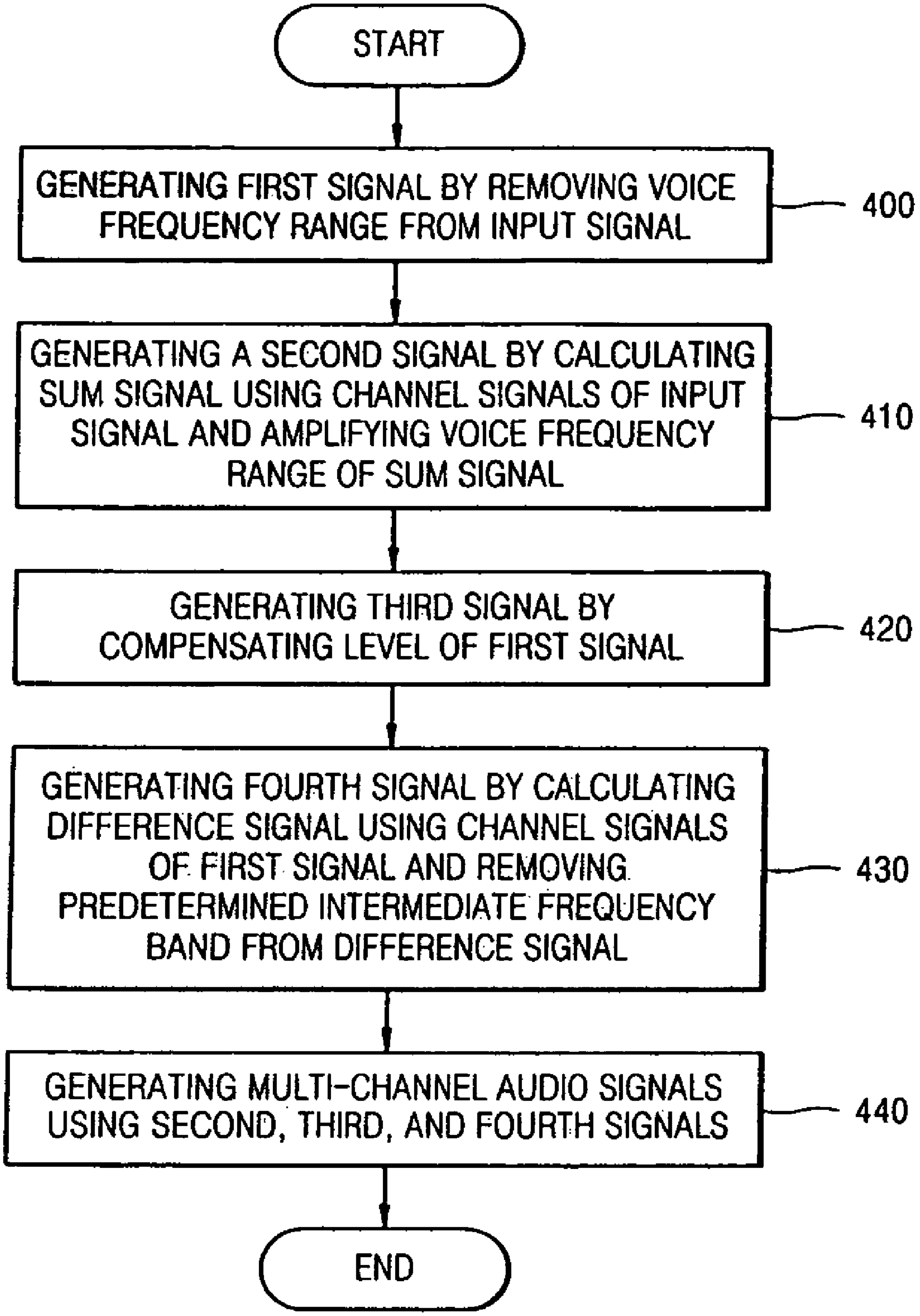
FIG. 4 is a flowchart illustrating a method of generating multi-channel audio signals according to an embodiment of the present general inventive concept.

FIG. 4 is a flowchart illustrating a method of generating multi-channel audio signals according to an embodiment of the present general inventive concept.

At first, a first signal is generated by removing a voice frequency range from an input signal (400). Then, a sum signal is calculated using channel signals of the input signal, and a second signal is generated by amplifying a voice frequency range of the sum signal at operation 410.

As a consequence a voice signal in the first signal is weak, and a voice signal in the second signal is strong.

When the first signal is generated, a third signal is generated by compensating for a level of the first signal at operation 420. A level of the first signal may be compensated by amplifying a predetermined intermediate frequency band of the first signal. The predetermined intermediate frequency band may be a frequency band of 1 kHz to 4 kHz. When the third signal is generated, a difference signal is calculated using channel signals of the first signal of which level is not compensated for, and a fourth signal is generated by removing components corresponding to a predetermined intermediate frequency band from the difference signal at operation 430. The predetermined intermediate frequency band may be a frequency band of 1 kHz to 4 kHz.

Finally, a center-channel audio signal, a front-channel audio signal, and a surround channel audio signal are generated by using the second signal, the third signal, and the fourth signal at operation 440.

Figure 5:
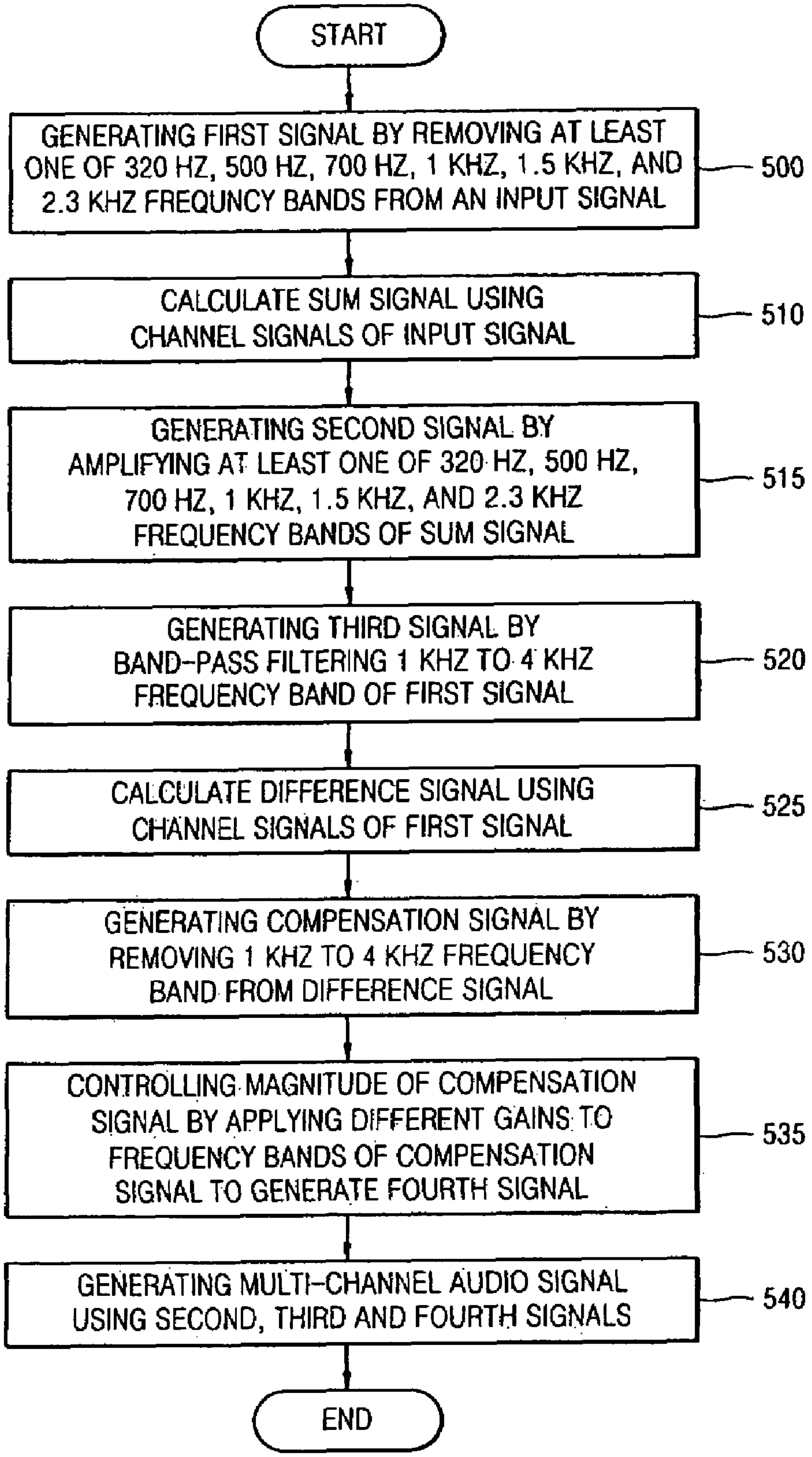
FIG. 5 is a detailed flowchart illustrating a method of generating multi-channel audio signals according to an embodiment of the general inventive concept.

FIG. 5 is a detailed flowchart illustrating a method of generating multi-channel audio signals according to an embodiment of the general inventive concept.

At first, a first signal is generated by removing at least one of frequency bands of 320 Hz, 500 Hz, 700 Hz, 1 kHz, 1.5 kHz, and 2.3 kHz at operation 500. In this process, components of a frequency band mainly including formant frequency components of an input signal are removed from the input signal. The process may filter the frequency bands described above for band-rejecting.

Then, a sum signal is calculated using channel signals of the input signal at operation 510. The sum signal is a signal in which components common to the channel signals are amplified.

When the sum signal is calculated as above, a second signal is generated by amplifying at least one of frequency bands of 320 Hz, 500 Hz, 700 Hz, 1 kHz, 1.5 kHz, and 2.3 kHz at operation 515). In this process, components of a frequency band mainly including formant components are amplified. This process may band-pass the same frequency bands as described above. The generating of the second signal at operation 515 may further include band-passing a frequency band of the sum signal in which a voice signal is mainly included. The generating of the second signal 515 may further include band-passing of a frequency band of 200 Hz to 2 kHz of the sum signal. A channel separation of a center channel of the multi-channel audio signals can be improved by this process.

Then, a third signal is generated by band-pass filtering a frequency band of 1 kHz to 4 kHz of the first signal at operation 520. In this process, a frequency band of 1 kHz to 4 kHz of the first signal is amplified. This process compensates for a band of 1 kHz to 4 kHz which is removed from a fourth signal which will be described below, in generating of the multi-channel signals.

When the third signal is generated, a difference signal is calculated using channel signals of the first signal of which level is not compensated for at operation 525. Here, the difference signal is a signal in which components common to channel signals are removed from the channel signals.

When the difference signal is calculated, a compensation signal is generated by removing a component corresponding to a frequency band of 1 kHz to 4 kHz from the difference signal at operation 530. When the component corresponding to this frequency band is not removed, a deterioration of a sound quality occurs in generating multi-channel signals. When the compensation signal is generated, a magnitude of the compensation signal is controlled by applying different gains to frequency bands of the compensation signal to generate a fourth signal at operation 535. This process is for applying an equalizer to the audio signal. Components of which magnitudes are distorted can be compensated for each of the frequency band by this process. The generating of the fourth signal may be amplifying a lower frequency band of the compensation signal comparatively and attenuating a higher frequency band of the compensation signal comparatively.

Finally, a center-channel audio signal, a front-channel audio signal, and a surround-channel audio signal are generated using the second signal, the third signal, and the fourth signal at operation 540. A detailed method of generating the signals is described with reference to FIG. 3.

As described above, according to the present general inventive concept, multi-channel audio signals are generated using a signal in which a component of a frequency band corresponding to the formant frequency range of an input signal is removed, and a signal in which the component of the frequency band corresponding to the formant frequency range of the input signal is amplified. In addition, according to the present general inventive concept, an encoded signal to generate multi-channel audio signals is not required, and high quality and high channel separation of a sound signal are accomplished, so that an amount of calculation for generating multi-channel audio signals can be minimized.

The present general inventive concept can also be embodied as a software program. When embodied as a software program, components of the present invention are code segments performing required operations. The program or code segments may be stored on a processor-readable medium or may be transferred by a computer data signal combined with a carrier signal in a transfer medium or a communication network.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An apparatus to generate multi-channel audio signals, comprising:

a voice signal removal unit to generate a first signal by removing one or more components of a plurality of frequency bands corresponding to a voice frequency range from an input signal having channel signals;

a voice component amplification unit to generate a second signal by calculating a sum signal of the channel signals of the input signal and amplifying one or more components of a plurality of the frequency bands of the sum signal corresponding to the voice frequency range;

a multi-channel audio signal generation unit to generate a center-channel audio signal and a front-channel audio signal using the first signal and the second signal; and a conditioning filter unit to generate another signal by calculating a difference signal using channel signals of the first and to remove one or more components corresponding to a predetermined intermediate frequency band from the difference signal, the conditioning filter including:

a band-reject filter to generate a compensation signal by removing one or more components corresponding to a predetermined intermediate frequency band from the difference signal; and an equalizer unit to control magnitudes of the compensation signal by applying different gains to frequency bands of the compensation signal to generate the another signal, wherein the multi-channel audio generation unit further generates a surround-channel audio signal according to the first signal and the another signal.

2. The apparatus of claim 1, wherein the voice signal removal unit comprises a plurality of notch filters to remove one or more components corresponding to a formant frequency range from the input signal.

3. The apparatus of claim 2, wherein the notch filters comprise two or more notch filters to remove the one or more components corresponding to at least two frequency bands of 320 Hz, 500 Hz, 700 Hz, 1 kHz, 1.5 kHz, and 2.3 kHz.

4. The apparatus of claim 1, wherein the voice component amplification unit comprises a plurality of band-pass filters to pass one or more components of a frequency band of the sum signal corresponding to a formant frequency range.

5. The apparatus of claim 4, wherein the band-pass filters comprise two or more band-pass filters to band-pass one or more components corresponding to at least two frequency bands of 320 Hz, 500 Hz, 700 Hz, 1 kHz, 1.5 kHz, and 2.3 kHz.

6. The apparatus of claim 1, further comprising:

a control filter to compensate for a level of the first signal by band-passing components . corresponding to a predetermined intermediate frequency band of the first signal to generate another signal, wherein the multi-channel audio signal generation unit generates the front channel audio signal using the another signal.

7. The apparatus of claim 6, wherein the predetermined intermediate frequency band comprises a frequency band of 1 kHz to 4 kHz.

8. The apparatus of claim 1, wherein the predetermined intermediate frequency band comprises a frequency band of 1 kHz to 4 from the difference signal.

9. An apparatus to generate multi-channel audio signals, comprising:

a voice signal removal unit to generate a first signal by removing one or more components of a plurality of frequency bands corresponding to a voice frequency range from an input signal having channel signals;

a voice component amplification unit to generate a second signal by calculating a sum signal of the channel signals of the input signals and amplifying one or more components of a plurality of the frequency bands of the sum signal corresponding to the voice frequency range;

a multi-channel audio signal generation unit to generate a center-channel audio signal and a front-channel audio signal using the first signal and the second signal;

a control filter to compensate for a level of the first signal by band-passing components corresponding to a predetermined intermediate frequency band of the first signal to generate a third signal; and a conditioning filter unit to generate a fourth by calculating a difference signal using channel signals of the first signal and to remove one or more components corresponding to a predetermined intermediate frequency band from the difference signal, wherein the multi-channel audio signal generation unit generates a center-channel audio signal, a front-channel audio signal, and a surround signal using the first, second, third, and fourth signals.

10. The apparatus of claim 9, wherein the multi-channel audio signal generation unit adds one of channel signals of the third signal to the fourth signal to generate a first channel signal of the surround signal, and subtracts the other one of the channel signals of the third signal from the fourth signal to generate a second channel signal of the surround signal.

11. The apparatus of claim 9, wherein the multi-channel audio signal generation unit controls gains of two channel signals of the third signal and the fourth signal, adds one of the gain-controlled channel signals of the third signal to the gain-controlled fourth signal to generate a first channel signal of the surround signal, and subtracts the other one of the gain-controlled channel signals of the third signal from the gain-controlled fourth signal to generate a second channel signal of the surround signal.

12. A method of generating multi-channel audio signals, the method comprising:

generating a first signal by removing one or more components of a plurality of frequency bands corresponding to a voice frequency range from an input signal;

generating a second signal by calculating a sum of channel signals of the input signal and amplifying the one or more components of at least one of the frequency bands corresponding to the voice frequency range;

generating a center-channel audio signal and a front-channel audio signal using the first signal and the second signal;

band-passing components corresponding to, a predetermined intermediate frequency band of the first signal to compensate for a level of the first signal to generate a third signal; and generating a fourth signal by calculating a difference signal using channel signals of the first signal and removing a component corresponding to a predetermined intermediate frequency band from the difference signal, wherein the generating of the center-channel audio signal and the front-channel audio signal comprises generating the center-channel audio signal, the front-channel audio signal, and a surround signal according to the first, second, third, and fourth signals.

13. The method of claim 12, wherein the generating of the first signal comprises removing the one or more components corresponding to a formant frequency range from the input signal.

14. The method of claim 13, wherein the removing of the one or more components corresponding to the formant frequency range comprises removing the one or more components corresponding to at least two frequency bands of 320 Hz, 500 Hz, 700 Hz, 1 kHz, 1.5 kHz, and 2.3 kHz.

15. The method of claim 12, wherein the generating of the second signal comprises filtering the one or more components of frequency bands of the sum signal corresponding to a formant frequency range for band-passing.

16. The method of claim 15, wherein the filtering of the components comprises band-passing the one or more components corresponding to at least two frequency bands of 320 Hz, 500 Hz, 700 Hz, 1 kHz, 1.5 kHz, and 2.3 kHz.

17. The method of claim 12, wherein the band-passing components corresponding to a predetermined intermediate frequency band of the first signal to compensate for a level of the first signal includes generating another signal, and wherein the generating of the front channel audio signal comprises generating the front channel audio signal using the another signal.

18. The method of claim 17, wherein the compensating of the level of the first signal comprises band-passing the components corresponding to a frequency band of 1 kHz to 4 kHz.

19. The method of claim 12, further comprising:

generating another signal by calculating a difference signal using channel signals of the first signal and removing a component corresponding to a predetermined intermediate frequency band from the difference signal, wherein the generating of the center-channel audio signal and the front-channel audio signal comprise generating a surround-channel audio signal by synthesizing the first signal and the another signal.

20. The method of claim 19, wherein the generating of the another signal comprises:

generating a compensation signal by removing components corresponding to the predetermined intermediate frequency band from the difference signal; and controlling a magnitude of the compensation signal by applying different gains to frequency bands of the compensation signal to generate the another signal.

21. The method of claim 20, wherein the generating of the compensation signal comprises removing a component corresponding to a frequency band of 1 kHz to 4 kHz from the difference signal.

22. The method of claim 12, wherein the generating of the center-channel audio signal, the front-channel audio signal, and the surround signal comprises adding one of channel signals of the third signal to the fourth signal to generate a first channel signal of the surround signal, and subtracting the other one of the channel signals of the third signal from the fourth signal to generate a second channel signal of the surround signal.

23. A non-transitory computer-readable medium having embodied thereon a computer program to perform a method of generating multi-channel audio signals, the method comprising:

generating a first signal by removing one or more components of a plurality of frequency bands corresponding to a voice frequency range from an input signal;

generating a second signal by calculating a sum of channel signals of the input signal and amplifying the one or more components of at least one of the frequency bands corresponding to the voice frequency range;

generating a center-channel audio signal and a front-channel audio signal using the first signal and the second signal;

band-passing components corresponding to a predetermined intermediate frequency band of the first signal to compensate for a level of the first signal to generate a third signal; and generating a fourth signal by calculating a difference signal using channel signals of the first signal and removing a component corresponding to a predetermined intermediate frequency band from the difference signal, wherein the generating of the center-channel audio signal and the front-channel audio signal comprises generating the center-channel audio signal, the front-channel audio signal, and a surround signal according to the first second third and fourth signals.

24. A method of generating multi-channel audio signals, the method comprising:

generating a sum of a plurality of channel signals of an input signal;

amplifying one or more components of at least one frequency band of the summed signal that corresponds to a predetermined frequency range;

generating a center-channel audio signal using at least the summed signal;

generating another signal by calculating a difference signal using one or more of the plurality of channel signals;

removing one or more components corresponding to a predetermined intermediate frequency band from the difference signal to generate a compensation signal by removing one or more components corresponding to a predetermined intermediate frequency band from the difference signal;

controlling magnitudes of the compensation signal by applying different gains to frequency bands of the compensation signal to generate the another signal; and generating a surround-channel audio signal according to the summed signal and the another signal.

25. An apparatus to generate multi-channel audio signals, comprising:

an adder to generate a sum of a plurality of channel signals of an input signal;

an amplifier to amplify one or more components of at least one frequency band of the summed signal from the adder that corresponds to a predetermined frequency range;

multi-channel audio signal generation unit to generate a center-channel audio signal using at least the summed signal; and a conditioning filter unit to generate another signal by calculating a difference signal using at least one of the plurality of channel signals and to remove one or more components corresponding to a predetermined intermediate frequency band from the difference signal, the conditioning filter including:

a band-reject filter to generate a compensation signal by removing one or more components corresponding to a predetermined intermediate frequency band from the difference signal; and an equalizer unit to control magnitudes of the compensation signal by applying different gains to frequency bands of the compensation signal to generate the another signal, wherein the multi-channel audio generation unit further generates a surround-channel audio signal according to the summed signal and the another signal.

* * * * *